United States Patent [19]
Sham et al.

[11] Patent Number: 5,844,960
[45] Date of Patent: Dec. 1, 1998

[54] SYNCHRONIZED VOLTAGE CONTROLLED OSCILLATOR LAP COUNTING CIRCUIT

[75] Inventors: Ka Yiu Sham, Great Falls, Va.; Philip Lim-Kong Wong, Kettering, England

[73] Assignee: Acumen, Inc., Sterling, Va.

[21] Appl. No.: 912,027

[22] Filed: Aug. 15, 1997

[51] Int. Cl.[6] .................................................. H03K 23/00
[52] U.S. Cl. .............................. 377/24.2; 377/5; 377/17; 324/247; 324/251
[58] Field of Search ................................. 377/24.2, 5, 17; 33/361; 324/247, 251, 207.2, 235

[56] References Cited

U.S. PATENT DOCUMENTS

| | | | |
|---|---|---|---|
| 3,905,121 | 9/1975 | Takeda et al. | 33/361 |
| 4,482,255 | 11/1984 | Gygax et al. | 368/10 |
| 4,530,105 | 7/1985 | Rabinowitz | 377/12 |
| 4,991,126 | 2/1991 | Reiter | 364/561 |
| 5,241,270 | 8/1993 | Ng | 324/251 |
| 5,500,585 | 3/1996 | Aab | 324/207.2 |
| 5,661,398 | 8/1997 | Sham et al. | 324/247 |

*Primary Examiner*—Margaret Rose Wambach
*Attorney, Agent, or Firm*—Evenson, McKeown, Edwards & Lenahan, P.L.L.C.

[57] ABSTRACT

A synchronized voltage controlled oscillator lap counting circuit includes a bearing resolver circuit having a single Hall-effect sensor element which provides differential voltage output signals in response to an external magnetic field. The differential amplifier receives the differential voltage output signals and provides a single amplified output signal. The single amplified output signal is provided to a voltage controlled oscillator. A pedometer provides a repetitive pulsed-output signal in accordance with movements of a user. The repetitive pulsed-output signal and a voltage controlled oscillator output signal are provided to a micro-controller. The micro-controller samples the voltage controlled output signal in synchronization with the repetitive pulsed signal output from the pedometer to resolve bearing directions based on intercepted frequencies of the voltage controlled output signal.

11 Claims, 3 Drawing Sheets

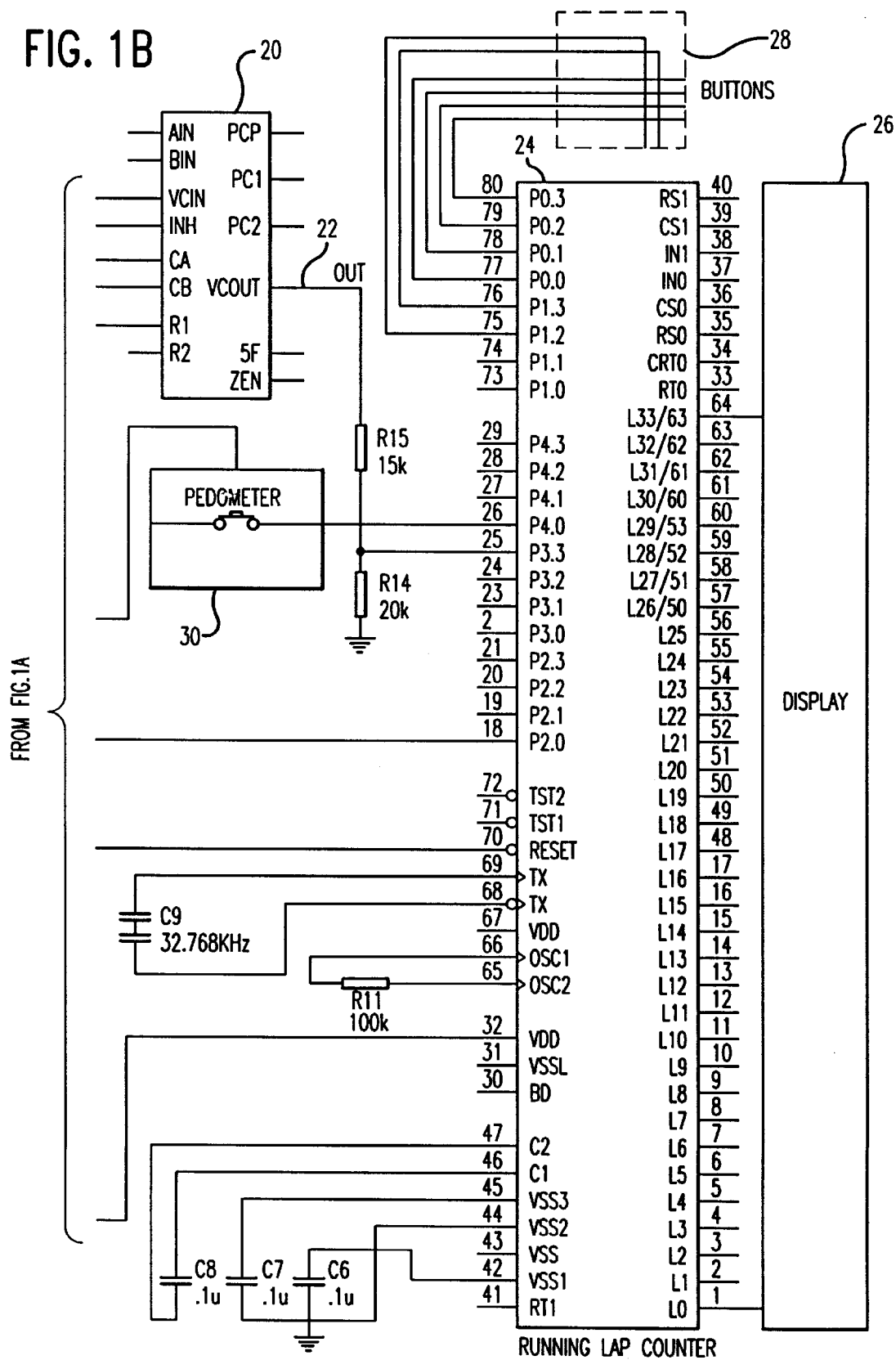

SYNCHRONIZED VOLTAGE CONTROLLED OSCILLATOR LAP COUNTING CIRCUIT

FIELD OF THE INVENTION

This invention relates to a lap counting circuit and, more particularly, to a lap counting circuit which makes use of the earth's magnetic field for automatically counting laps.

BACKGROUND OF THE INVENTION

Numerous sports and other fitness activities require that the participant keep track of the number of laps completed. For example, a jogger training on a track may run several laps during a training session. Often times, the person loses track of the number of laps completed and is thus unable to determine how far he has run, swam, biked, etc.

A known method for keeping track of the number of laps performed requires that the user manually activate a button or switch on a watch or the like each time a lap is completed. However, many times the runner forgets to activate the switch due, for example, to the monotony of the training.

U.S. Pat. No. 4,530,105 describes an automatic lap counter which depends upon the change in the magnetic line of force of the north/south magnetic field for determining laps. The device operates using either an electronic or mechanical flux change detector to detect each 180° shift and direction. Each 180° change produces a pulse which is counted and displayed on a watch. The flux detector makes use of a compass needle mounted to, and operating, a cam plate. A cam follower switch contact is operated when the cam turns through 180° responsive to the change and direction of the user. The cam follower closes a switch which activates a battery to produce the pulse. This known mechanical circuit is disadvantageous as only 180° directional changes are detected. Further, the device requires that the user begin his training in a north or south direction in order to keep an accurate track of the laps. However, this is not necessarily convenient for the user as a north or south direction often times is not the optimal starting point for the training. Still further, this known circuit is mechanically crude and can be subject to numerous erroneous lap counts due to the inaccuracy and fluctuation of the compass needle.

U.S. Pat. Nos. 3,905,121, 4,991,126, 4,482,255 and 5,241,270 disclose the use of Hall-effect elements for determining the direction and sense of the terrestrial magnetic field. However, neither of these references provide any lap counting indications.

There is therefore needed a circuit which accurately and effectively resolves the earth's magnetic field in order to allow for a lap count determination.

One such circuit is described in co-pending application Ser. No. 08/497,448, filed Jun. 30, 1995 and commonly assigned to the assignee of the present invention, the disclosure of which is specifically incorporated by reference herein. In application Ser. No. 08/497,448, an eight bearing magnetic resolving circuit having high sensitivity to the earth's magnetic field is provided. The circuit for resolving the magnetic field includes a first channel having a first magnetic field sensor, a first amplifier coupled to and receiving an output from the first magnetic field sensor, and a three band detector coupled to and receiving an output from the first amplifier. The first three band detector provides a first two bit output. A second channel includes a second magnetic field sensor, a second amplifier coupled to and receiving an output from the second magnetic field sensor, and a second three-band detector coupled to and receiving an output from the second amplifier. The second three-band detector provides a second two bit output. The first and second magnetic field sensors are arranged orthogonally to one another such that the first and second two bit outputs resolve the magnetic field into eight bearings. The two sensor pairs are each composed of two linear Hall-effect sensors arranged together in a back-to-back manner. A magnetic concentrator such as a MU-metal rod assembly is provided for each sensor pair to improve the sensitivity of the Hall-effect sensor pairs.

This known circuit provides a fundamental principle approach to resolving the earth's magnetic field, i.e., the terrestrial magnetism, into eight bearings/directions such as N, NE, E, SE, S, SW, W, NW. These directional findings are then applied to a processor such that when passage through each of the bearings is detected, a first lap is counted. However, because of the various movements of the user during the fitness activity, there is no guarantee that the known resolver circuit will be in the same position each time it detects a bearing crossing. This has an adverse effect on the accuracy and reliability of the known circuit.

There is therefore needed a circuit which increases the accuracy and effectively resolves the earth's magnetic field in order to allow for a lap count determination while taking into account the various movements of the user during the fitness activity.

SUMMARY OF THE INVENTION

These needs are met according to the present invention which provides a voltage controlled oscillator lap counting circuit synchronized with the movements of the user.

A bearing resolver circuit includes a single Hall-effect sensor element which provides differential voltage output signals in response to an external magnetic field. A differential amplifier receives the differential voltage output signals and provides a single amplified output signal. A voltage controlled oscillator receives the single amplified output signal and provides a voltage controlled oscillator output signal. A pedometer in the bearing resolver circuit provides a repetitive pulsed-output signal in accordance with movements of a user. A micro-controller receives the repetitive pulsed-output signal from the pedometer and the voltage controlled output signal from the voltage controlled oscillator. The micro-controller samples the voltage controlled output signal in synchronization with the pulsed signal output from the pedometer to resolve bearing directions based on sampled frequencies of the voltage controlled output signal.

It is an advantage of the present invention that the micro-controller can accurately resolve thirty-six bearing directions. The micro-controller further tracks the interception of these bearing directions in order to determine when a full lap is completed.

The use of the pedometer in conjunction with the voltage controlled oscillator output signal is advantageous as it synchronizes or correlates the sampled magnetic bearing and heading directions with the coordinated movements of the user. Therefore, valid data is sampled.

Other objects, advantages and novel features of the present invention will become apparent from the following detailed description of the invention when considered in conjunction with the accompanying drawings.

DETAILED DESCRIPTION OF THE DRAWINGS

Figure 1A:
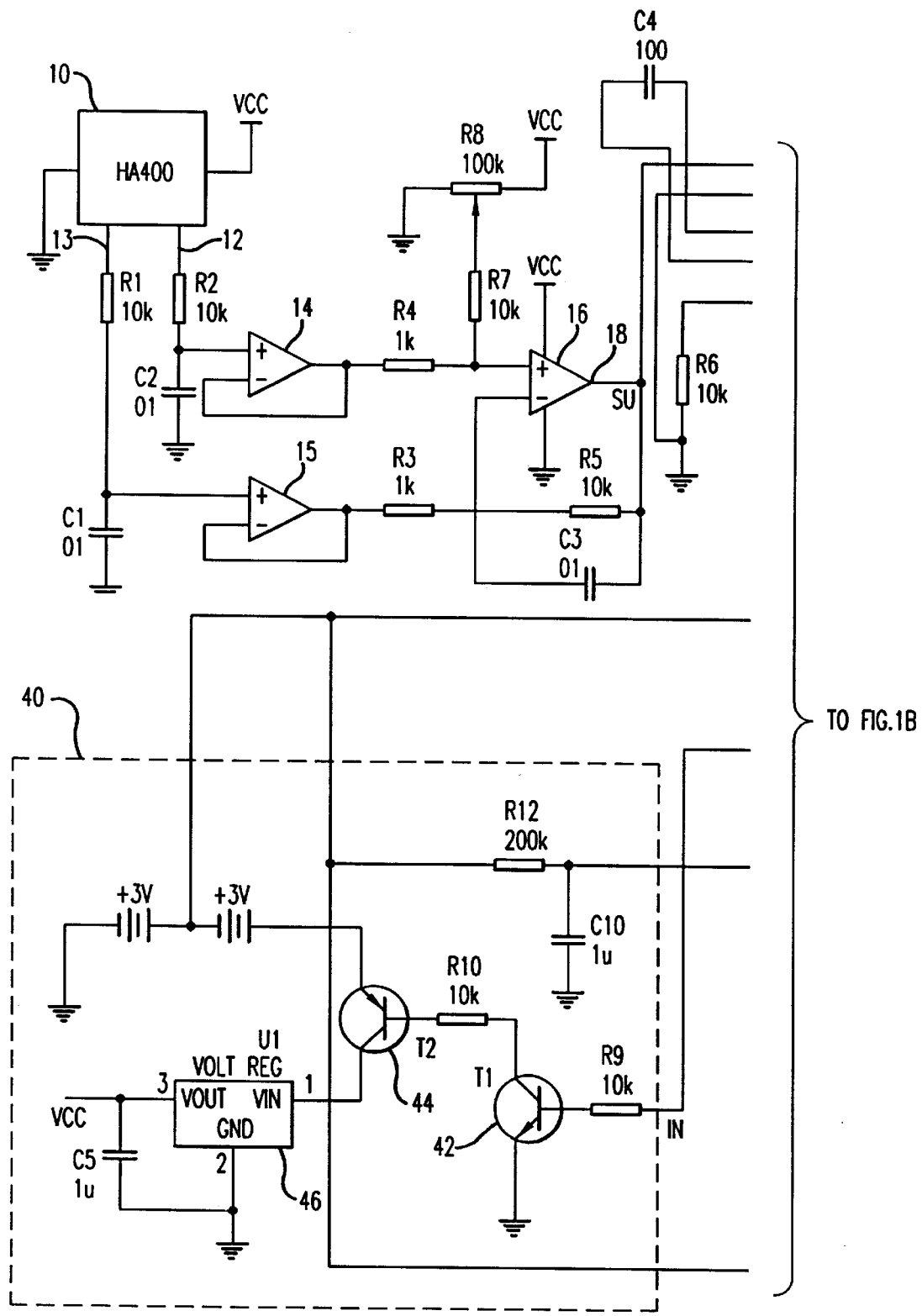
FIG. 1 is a schematic circuit diagram of a synchronized voltage controlled oscillator lap counting circuit according to the present invention.

Referring to FIG. 1, the circuit includes a single Hall-effect element 10 which is energized via a supply voltage $V_{cc}$ to pass a current through the element 10. As a result, when a Hall-effect voltage is developed across the Hall-effect sensor in a direction perpendicular to both the direction of flow of the energizing current and the direction of the earth's magnetic field, the magnitude and sense of the Hall-effect voltage signal output is a function of the relative alignment of the Hall-effect sensor with the magnetic field.

The Hall-effect element 10 provides differential voltage output signals 12, 13 in response to the earth's magnetic field, i.e., the external terrestrial magnetic field strength. The differential voltage output signals 12, 13 are provided through resistors R2, R1 to the positive inputs of buffers 14, 15, respectively. Capacitors C2, C1 are arranged in series between the respective resistors R2, R1 and a ground potential. In preferred embodiments, the resistors R2, R1 are 10 kΩ resistors and the capacitors C2, C1 are 0.01 MF capacitors. While not shown, the buffers 14, 15 receive the supply voltage $V_{cc}$ and are also coupled to ground. The buffers 14, 15 hold the differential voltage output signals 12, 13 from the Hall-effect element 10.

The differential voltage output signals from the buffers 14, 15 are passed through respective resistors R4, R3 and are provided as positive and negative inputs to a differential amplifier 16. The differential amplifier 16 converts the input signals into a single output signal 18 with a gain. Additionally, a resistor R8 is coupled between the supply voltage $V_{cc}$ and ground with a further resistor R7 to the positive input terminal of the differential amplifier 16. Resistors R7, R8 form a mid-rail biasing voltage for the differential amplifier 16 having a single rail supply. The mid-rail biasing voltage allows the differential amplifier 16 to function correctly with respect to a biasing point. In preferred embodiments, resistor R7 has a value of 10 kΩ and resistors R8 a value of 100 kΩ.

The single amplified output signal 18 from the differential amplifier 16 is provided as an input $VC_{in}$ to a voltage controlled oscillator 20 (VCO). The voltage controlled oscillator 20 can be, for example, a Model 4046 VCO. The voltage controlled oscillator 20 provides an output signal $VC_{out}$ 22 in the form of a digital pulse train having a frequency which varies linearly in accordance with the analog input signal level received at the input $VC_{in}$. A capacitor C4 is also coupled to input terminals CA, CB of the VCO 20. The value of the capacitor C4 in combination with that of resistor R1 sets an upper frequency of the VCO denoted as f(max) in response to the maximum DC supply voltage $V_{cc}$ at the VCO's control input.

A micro-controller 24, such as a Model MSM64164 micro-controller, receives the output signal 22 from the VCO 20 through resistor R15. The output signal 22 is coupled to ground through the series coupled resistors R15, R14, preferably having values of 15 kΩ and 20 kΩ, respectively.

The micro-controller 24 reads the digital pulse train's frequency from the voltage controlled oscillator 20. More precisely, it is the period of the digital pulse train output which is read via the micro-controller 24. The micro-controller 24 is further coupled to a display 26 which can be viewed by the user. Operating elements 28, such as buttons, are provided to allow the user to operate the features of the micro-controller.

Also coupled to the micro-controller 24 are capacitors C6, C7 and C8 along with a resistor R11. In preferred embodiments, the resistor R11 has a value of 100 kΩ, and capacitors C6–C8 have a value of 0.1 μF. These components allow the micro-controller 24 to operate properly. Also coupled to the micro-controller 24 for proper operation is a crystal oscillator C9, preferably a 32.768 Khz crystal oscillator.

With the above described circuit, as the Hall-effect sensor element 10 is subjected to varying levels of intensity of the earth's magnetic field, the VCO output signal frequency 22, i.e., the digital pulse train, varies in proportion to the sensed intensity. The micro-controller 24 interprets the period of the VCO output signal frequency 22 in order to determine the intercepted terrestrial magnetic field strength.

Also coupled to the micro-controller 24 is a micro-pedometer 30. The micro-pedometer 30 functions to provide a timing signal for the micro-controller 24. The micro-pedometer 30 can be of a conventional, electronic-type, which responds to the body motion of its user with each step of the user. The micro-pedometer 30 provides a pulse signal to the micro-controller 24 instantaneously at each step in order to provide direction correlation. These pulses form a timing signal for the micro-controller 24 in order to sample the VCO output signal frequency 22.

A power circuit 40 (shown generally in broken lines) is provided for supplying power to the micro-controller 24, pedometer 30, and the magnetic sensing electronics. The power control circuit 40 includes transistors 42 and 44 for switching the power supply $V_{cc}$ on and off. The supply voltage $V_{cc}$ is coupled from the transistor 44 through a voltage regulator 46. The micro-controller 24 can control the power supply circuit 40 in order to shut down the peripheral electronics as a power-saving feature when the Hall-effect sensor 10 and its associated electronics are not in use.

The micro-controller 24 is programmed to, among other things, track the terrestrial magnetic field strength, the pedometer synchronization, and the fitness activity monitoring functions such as lap counts, total time, split time between laps, and the like. The micro-controller 24 further manages the power saving features, and outputs performance data to the display 26. The programming of such a micro-controller 24 is readily accomplished by one of ordinary skill in the art to perform the described functions. The buttons 28 allow the user to select and display the desired features.

In operation, the use of the high sensitivity Hall-effect element 10 as a magnetic sensor (without requiring the use of a magnetic concentrator, MU-metal), provides a voltage output signal in proportion to the strength of the terrestrial magnetism. The output voltage signal is at a maximum when the Hall-effect element 10 is facing the magnetic north and at a minimum when facing the magnetic south direction. As noted above, the output voltage signal from the Hall-effect sensor 10 is coupled to the VCO 20. The characteristics of the VCO 20 are such that it has a free running central frequency and span subjected to an input DC voltage. In addition, the center frequency can be externally pre-adjusted or "off-set" to a set frequency for optimum use. For example, the set frequency could match the sampling speed of the micro-controller 24.

As the Hall-effect sensor 10 is rotated 360° through the earth's magnetic field, the VCO 20 outputs a digital pulse train 22 whose frequency varies in accordance with the earth's magnetic field strength. Thus, in a continuous fashion the VCO output signal 22, varying in frequency (frequency modulation), is either increasing in frequency or decreasing In frequency in accordance with whether the input voltage $VC_{in}$ is either ramping up or ramping down due to the strength of the earth's magnetic field. For example, in a 360° turn, the VCO output signal frequency 22 can reach a maximum of 6000 Hz and a minimum of 1000 Hz, with the cycle repeating itself. That is to say, the frequency span through a turn of 180° is about 5000 Hz, i.e., 6000 Hz–1000 Hz. Therefore, the frequency change per degree of turn is roughly 5000/180=28 Hz. In general, the earth's magnetic field linkage with the Hall-effect sensor's active surface as it rotates through 360° in the terrestrial magnetism has a cosign function as its output.

Continuing the example, the micro-controller 24 is thus faced with a rather large frequency change to attempt to distinguish in the ideal situation, i.e., 28 Hz per degree. However, it is readily possible for the micro-controller 24 to resolve thirty-six (36) bearings of 10° each without any difficulty. This allows for some tolerance in the system as well as any delays in the sampling time of the micro-controller. Hence, the present invention can, in practice, easily resolve 36 bearings or bands of frequency each having a span of 280 Hz, i.e., 360°/36=10°×28 Hz/1°=280 Hz.

The synchronized voltage controlled oscillator lap counting circuit according to the present invention thus provides an improved 36 bearing resolving capability as opposed to the 8 bearings resolver previously known. This thus provides improved accuracy in order to validate a lap count. Care must be taken, however, not to attempt to resolve a much smaller angle, for example, better than 10° of resolution, as a single step by the walker/jogger could easily span over such a small angle hence might miss triggering the reference bearing.

It is an especially advantageous feature of the present invention that no reference need be made to the true magnetic north or any other absolute geo-orientation. Rather, a simple reference bearing is used for relative measurement. Thus, the synchronized voltage controlled oscillator lap counting circuit only requires the use of one Hall-effect sensor 10. This achieves a reduction in cost as well as a power savings which is especially advantageous. The power saving feature of the circuit according to the present invention is especially important when the circuit is used in a wrist-watch type of lap counter as the battery size, and hence capacity, which ultimately determines the battery's life is a key concern with respect to the longitivity and weight of the device.

The synchronized voltage control oscillator lap counting circuit according to the present invention provides an improved wrist-watch lap counter applicable to joggers, walkers or the like. Due to the erratic movement of the jogger's arm/hand during the fitness activity, the conventional magnetic field sensing circuits disadvantageously intercept bearings at various positions. This provides only random data which cannot effectively be used for lap counting. The circuit according to the present invention provides synchronization or correlation between the sampled magnetic bearing and heading directions of the user by gating the sample data at the correct instant in order to validate the lap counter. The use of the pedometer 30 accomplishes this function. The micro-pedometer 30 outputs a single pulse each time, and at the precise instance, that the user makes a step forward. This pulse output is received by the micro-controller 24 which operates to sample the VCO output signal frequency 22 at that time.

The advantage of the micro-pedometer 30 is that each time the micro-pedometer outputs a pulse signal, the user is generally stepping in a forward direction and hence their leg/body/arm/hand movements are coordinated. The leg/body/arm/hand movements of the user are repetitive in accordance with their particular body physique. Hence, the repetitive nature of such movements becomes predictable with each cycle of the micro-pedometer 30. Thus, the general heading direction sampled by the micro-controller 24 at each instance of the pulse signal from the micro-pedometer 30 becomes valid, predictable data. This allows the present invention to provide a magnetic direction/bearing indicator which is sampled in synchronization with the micro-pedometer in order to realize an accurate lap counting device.

In order to accomplish lap counting, upon initializing the circuit shown in FIG. 1, a reference bearing is taken via the micro-controller 24. The micro-controller 24 is thus programmed to sample the magnetic bearing directions in accordance with the pace of the micro-pedometer 30. The micro-controller 24 keeps track of the consecutive bearings necessary in order to determine when a lap is completed. For example, when the same bearing is sampled and qualified for the second time, a lap count is updated via the micro-controller 24. The display 26 coupled to the micro-controller 24 provides a visual indication of the lap count, as well as various other conventional functions, to the user.

Figure 2:
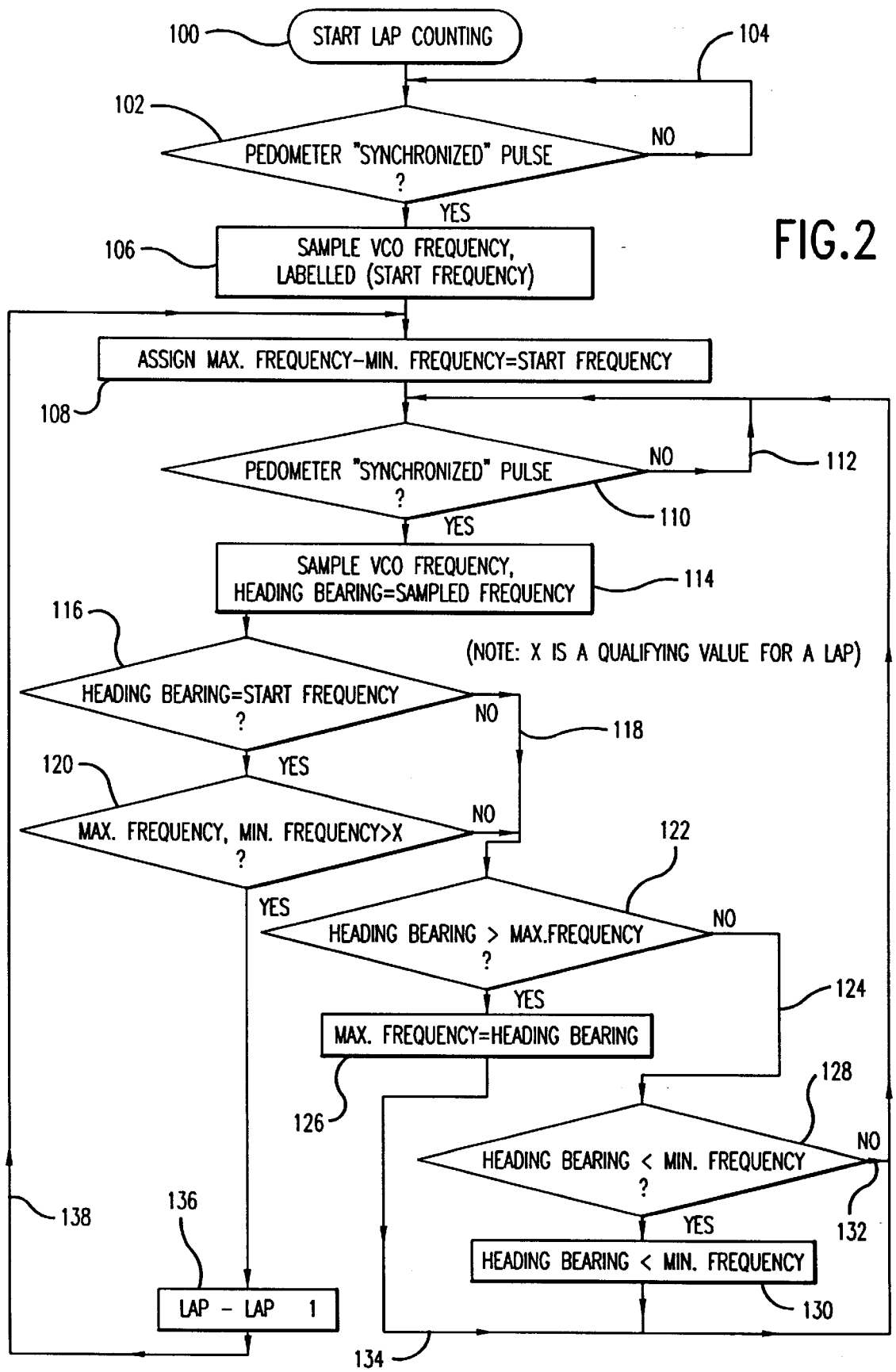
FIG. 2 is a flow chart illustrating the operation of the circuit and its program for determining bearing directions based on sampled VCO frequencies.

Referring to FIG. 2, there is shown a simplified flowchart diagram illustrating the operation of the lap counting circuit in accordance with a program operable via the micro-controller 24. Initially, lap counting is started at step 100. Thereafter, at step 102, the program determines whether a synchronization pulse has been received from the pedometer. If not, the program continues to look for the synchronization pulse as indicated by loop 104. Once a synchronization pulse is received, the micro-controller 24 samples the VCO frequency at step 106. The sampled VCO frequency is identified as the "start frequency". Thereafter, micro-controller assigns either a maximum or minimum frequency as the start frequency at step 108. Next, the program awaits the receipt of a further synchronization pulse at step 110 in conjunction with loop 112. Once a further synchronization pulse is received from the pedometer 30, the micro-controller 24 again samples the VCO frequency at step 114. At this point, it is determined whether the heading bearing equals the sampled frequency (step 116). If yes, then the program determines at step 120 whether either the maximum frequency or the minimum frequency are greater than a predetermined value "x". It should be noted that the value "x" is set as the qualifying value for the completion of a lap. If x is exceeded, then the program at step 136 increments the lap count by one and returns the control to step 108 as shown via loop 138.

If, however, at step 116, the heading bearing does not equal the start frequency, then it is determined at step 122 whether the heading bearing is greater than the maximum frequency. Similarly, if at step 120 the maximum frequency or the minimum frequency is found not to be greater than the qualifying value x, then it is also checked with the heading bearing is greater than the maximum frequency.

At step 122, if it is determined that the heading bearing is greater than the maximum frequency, then step 126 assigns the maximum frequency equals the heading bearing. If so, then the control again returns to step 110 to await the next synchronization pulse as shown by loop 134. However, if the heading bearing is not greater than the maximum frequency at step 122, then it is determined whether the heading bearing is less than the minimum frequency at step 128. If not, then control is again returned to step 110 to await the next synchronization pulse as shown by loop 132. However, when the heading bearing is determined to be less than the minimum frequency, then it is assigned at step 130 that the minimum frequency equals the heading bearing. If so, the control again returns to step 110 to await the next synchronization pulse.

In the above-described manner, the program stored in the micro-controller 24 operates in accordance with the sampled frequencies from the VCO 20 in conjunction with the synchronization pulses from the pedometer 30 to provide an accurate lap count.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed is:

1. A bearing resolving circuit, comprising:
    a Hall-effect sensor element providing differential voltage output signals in response to an external magnetic field;
    a differential amplifier receiving said differential voltage output signals and providing a single amplified output signal;
    a voltage controlled oscillator receiving said single amplified output signal and providing a voltage controlled oscillator output signal;
    a pedometer providing a repetitive pulsed-output signal in accordance with movements of a user;
    a micro-controller receiving said repetitive pulsed-output signal from said pedometer and said voltage controlled output signal from said voltage controlled oscillator;
    wherein said micro-controller samples said voltage controlled output signal in synchronization with the repetitive pulsed signal output from the pedometer to resolve bearing directions based on frequencies of the voltage controlled output signal.

2. The bearing resolving circuit according to claim 1, wherein said micro-controller resolves thirty-six bearing directions based on said frequency of the voltage controlled output signal.

3. The bearing resolving circuit according to claim 2, wherein a frequency band of each of said bearing directions is about 280 Hz.

4. The bearing resolving circuit according to claim 1, further comprising:
    a power source coupled to said micro-controller, said micro-controller being programmed to operate said power source in a power saving manner.

5. The bearing resolving circuit according to claim 1, further comprising:
    a display coupled to said micro-controller, said micro-controller providing output data to said display.

6. The bearing resolving circuit according to claim 1, further comprising:
    first and second buffer circuits coupled between said Hall-effect sensor element and said differential amplifier, each of said buffer circuits receiving a differential voltage output signal from said Hall-effect sensor element.

7. The bearing resolving circuit according to claim 1, wherein said voltage controlled oscillator has a free running central frequency and span subjected to the single amplified output signal, a center frequency of said free running central frequency being externally pre-adjusted to a set frequency.

8. The bearing resolving circuit according to claim 7, wherein said set frequency matches a sampling speed of said micro-controller.

9. A lap counting circuit, comprising:
    a bearing resolver circuit including:
        a Hall-effect sensor element providing differential voltage output signals in response to an external magnetic field;
        a differential amplifier receiving said differential voltage output signals and providing a single amplified output signal;
        a voltage controlled oscillator receiving said single amplified output signal and providing a voltage controlled oscillator output signal;
        a pedometer providing a repetitive pulsed-output signal in accordance with movements of a user;
        a micro-controller receiving said repetitive pulsed-output signal from said pedometer and said voltage controlled output signal from said voltage controlled oscillator;
    wherein said micro-controller samples said voltage controlled output signal in synchronization with the repetitive pulsed signal output from the pedometer to resolve bearing directions based on frequencies of the voltage controlled output signal; and
    wherein said micro-controller tracks the bearing direction to determine when a lap is completed.

10. The lap counting circuit according to claim 9, wherein said micro-controller resolves thirty-six bearing directions, said lap being completed when said micro-controller detects an interception of each of said thirty-six bearing directions.

11. The lap counting circuit according to claim 10, further comprising:
    a display coupled to said micro-controller;
    operating elements coupled to said micro-controller;
    wherein said micro-controller provides lap counting data to said display for viewing by a user, and wherein said operating elements allow the user to control lap counting features of said micro-controller.

* * * * *